United States Patent
Mahoney et al.

(10) Patent No.: US 9,123,738 B1
(45) Date of Patent: Sep. 1, 2015

(54) TRANSMISSION LINE VIA STRUCTURE

(71) Applicant: Xilinx, Inc., San Jose, CA (US)

(72) Inventors: David M. Mahoney, Gilroy, CA (US); Mohsen H. Mardi, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/280,223

(22) Filed: May 16, 2014

(51) Int. Cl.
*H01L 23/58* (2006.01)
*H01L 21/44* (2006.01)
*H01L 23/66* (2006.01)
*H01L 21/768* (2006.01)

(52) U.S. Cl.
CPC .......... *H01L 23/66* (2013.01); *H01L 21/76877* (2013.01); *H01L 2223/6616* (2013.01)

(58) Field of Classification Search
CPC .................... H01L 23/66; H01L 21/76898
USPC .......................................... 257/664; 438/667
See application file for complete search history.

(56) References Cited

U.S. PATENT DOCUMENTS

| | | |
|---|---|---|
| 5,128,737 A | 7/1992 | van der Have |
| 6,072,690 A | 6/2000 | Farooq et al. |
| 7,012,489 B2 | 3/2006 | Sherrer et al. |
| 7,405,477 B1 | 7/2008 | Tao et al. |
| 7,932,584 B2 | 4/2011 | Trezza |
| 8,216,936 B1 | 7/2012 | Rahman |
| 8,384,225 B2 | 2/2013 | Rahman et al. |
| 8,519,542 B2 | 8/2013 | Kim et al. |
| 8,542,079 B2 | 9/2013 | Sherrer et al. |
| 8,692,381 B1 | 4/2014 | Hart |
| 2004/0196122 A1* | 10/2004 | Fisher et al. ................. 333/246 |
| 2005/0121768 A1* | 6/2005 | Edelstein et al. ............. 257/698 |
| 2005/0245063 A1 | 11/2005 | Chinthakindi et al. |
| 2006/0001174 A1* | 1/2006 | Matsui .......................... 257/774 |
| 2007/0069364 A1 | 3/2007 | Kawano et al. |
| 2007/0126085 A1 | 6/2007 | Kawano et al. |
| 2007/0161235 A1* | 7/2007 | Trezza ........................ 438/667 |
| 2007/0222021 A1 | 9/2007 | Yao |
| 2008/0122031 A1 | 5/2008 | DeNatale et al. |
| 2008/0127489 A1 | 6/2008 | Komuro |
| 2009/0051012 A1 | 2/2009 | Maebashi |

(Continued)

FOREIGN PATENT DOCUMENTS

WO    9639012    12/1996

OTHER PUBLICATIONS

U.S. Appl. No. 13/267,790, filed Oct. 6, 2011, Kim et al.

(Continued)

*Primary Examiner* — Fernando L Toledo
*Assistant Examiner* — Neil Prasad
(74) *Attorney, Agent, or Firm* — Robert Brush

(57) ABSTRACT

In a transmission line via structure, a plurality of sub-structures are stacked in a via through the substrate along a longitudinal axis thereof. Each of the sub-structures includes a center conductor portion, an outer conductor portion, and at least one dielectric support member. The center conductor portion extends along the longitudinal axis. The outer conductor portion is disposed around the center conductor portion. The dielectric support member(s) separate the outer conductor portion and the center conductor portion and provide a non-solid volume between the outer conductor portion and the center conductor portion. Conductive paste is disposed between the center and outer conductor portions of successive ones of the plurality of sub-structures to form an outer conductor and a center conductor.

20 Claims, 9 Drawing Sheets

(56) References Cited

U.S. PATENT DOCUMENTS

| | | |
|---|---|---|
| 2009/0130846 A1 | 5/2009 | Mistuhashi |
| 2009/0201654 A1 | 8/2009 | Simonovich et al. |
| 2010/0032808 A1 | 2/2010 | Ding et al. |
| 2011/0019375 A1 | 1/2011 | Hardin et al. |
| 2011/0084358 A1 | 4/2011 | Kim et al. |
| 2011/0095435 A1* | 4/2011 | Volant et al. .................. 257/774 |
| 2011/0291287 A1 | 12/2011 | Wu et al. |
| 2013/0161825 A1* | 6/2013 | Hsu et al. ...................... 257/774 |
| 2014/0235103 A1* | 8/2014 | Mason et al. ............ 439/607.08 |
| 2014/0264921 A1* | 9/2014 | Gao et al. ....................... 257/774 |

OTHER PUBLICATIONS

Ho, Soon Wee et al., "High RF Performance TSV Silicon Carrier for High Frequency Application," *Proc. of the 2008 Electronic Components and Technology Conference*, May 27, 2008, pp. 1946-1952, IEEE, Piscataway, New Jersey, USA.

Khan, Nauman H., "Power Delivery Design for 3-D ICs Using Different Through-Silicon Via (TSV) Technologies," *IEEE Transactions on Very Large Scale Integration (VLSI) Systems*, Apr. 2011, pp. 647-658, vol. 19, No. 4, IEEE, Piscataway, New Jersey, USA.

Kim, Namhoon et al., "Interposer Design Optimization for High Frequency Signal Transmission in Passive and Active Interposer using Through Silicon Via (TSV)" *Proc. of the 2011 IEEE 61st Electronic Components and Technology Conference (ECTC)*, May 31, 2011, pp. 1160-1167, IEEE, Piscataway, New Jersey, USA.

Specification and drawings for U.S. Appl. No. 12/868,529, filed Aug. 25, 2010, Kim et al.

* cited by examiner

TRANSMISSION LINE VIA STRUCTURE

TECHNICAL FIELD

The disclosure generally relates to semiconductor devices and processes and, in particular, to transmission line via structures in semiconductor devices.

BACKGROUND

Some electronic devices employ signals with a high enough frequency that their wave nature must be taken into account and the length of wires or traces on a printed circuit board (PCB) cannot be ignored. To propagate such high-frequency signals, PCBs include transmission line traces between electronic components. In order to route transmission line traces from one side of the PCB to another, a transmission line via is necessary having an impedance that matches the transmission lines. One type of transmission line via is a coaxial via that has an outer ground conductor that surrounds a center signal conductor with a solid dielectric between.

SUMMARY

In an example, a transmission line via structure in a substrate is described. The transmission line via structure includes a plurality of sub-structures stacked in a via through the substrate along a longitudinal axis thereof. Each of the sub-structures includes a center conductor portion, an outer conductor portion, and at least one dielectric support member. The center conductor portion extends along the longitudinal axis. The outer conductor portion is disposed around the center conductor portion. The dielectric support member(s) separate the outer conductor portion and the center conductor portion and provide a non-solid volume between the outer conductor portion and the center conductor portion. Conductive paste is disposed between the center and outer conductor portions of successive ones of the plurality of sub-structures to form an outer conductor and a center conductor.

In another example, a method of forming a transmission line structure in a substrate includes forming a via in the substrate extending between top and bottom surfaces thereof along a longitudinal axis. An outer conductor is formed on a wall of the via. A dielectric structure is established in the via. The dielectric structure includes dielectric support members disposed along the longitudinal axis with sacrificial material therebetween. A center via is formed in the dielectric structure. A center conductor is formed in the center via. The sacrificial material is removed from the dielectric structure providing a non-solid volume between the center conductor and the outer conductor.

In another example, a method of forming a transmission line structure in a substrate includes forming a via in the substrate extending between top and bottom surfaces thereof along a longitudinal axis. A plurality of sub-structures are formed, each of the plurality of sub-structures including an outer conductor portion separated from an center conductor portion by dielectric support members and including sacrificial material between the dielectric support members. The plurality of sub-structures are stacked in the via with conductive paste between the outer and center conductor portions of successive ones of the dielectric sub-structures to form an outer conductor and a center conductor. The sacrificial material is removed from each of the plurality of sub-structures providing a non-solid volume between the center conductor portion and the outer conductor portion.

BRIEF DESCRIPTION OF THE DRAWINGS

So that the above recited structures and methods can be understood in detail, a more particular description may be had by reference to particular examples, some of which are illustrated in the appended drawings. It is to be noted, however, that the appended drawings are purely exemplary in nature and are therefore not to be considered limiting in scope, for the invention may admit to other equally effective embodiments.

To facilitate understanding, identical reference numerals have been used, where possible, to designate identical elements that are common to the figures. It is contemplated that elements of one example may be beneficially incorporated in other implementations.

DETAILED DESCRIPTION

Transmission line via structures are described. In an example, a coaxial via structure is formed in a substrate, such as a printed circuit board (PCB). The coaxial via structure includes an outer conductor disposed around a center conductor. One or more dielectric support members are disposed in the via to support the center conductor and separate the center conductor from the outer conductor. No solid material is disposed between dielectric support members along the longitudinal axis of the via. Rather, the volume between dielectric support members is filled with air. The dielectric support members can be made such that the dielectric structure is substantially air. Using a substantially air-based dielectric allows for reduced size vias as compared to solid dielectric transmission line vias. This can improve PCB routing and conserves PCB real estate.

In an example, high aspect ratio vias can be formed by first forming coaxial sub-structures. Each sub-structure includes an outer conductor portion around a center conductor portion. Dielectric support member(s) support the center conductor. The sub-structures can be stacked in the via with conductive paste electrically coupling the outer and center conductor portions, as well as mechanically securing the sub-structures to one another. Vias with a center conductor having a length-to-diameter ratio of greater than 30:1 can be created.

In examples described herein, a dielectric structure substantially comprising air can be formed by alternately stacking dielectric support members and sacrificial material. The dielectric support members can include bores through which the sacrificial material can be removed. The volume left after removal of the sacrificial material fills with air.

Figure 1:
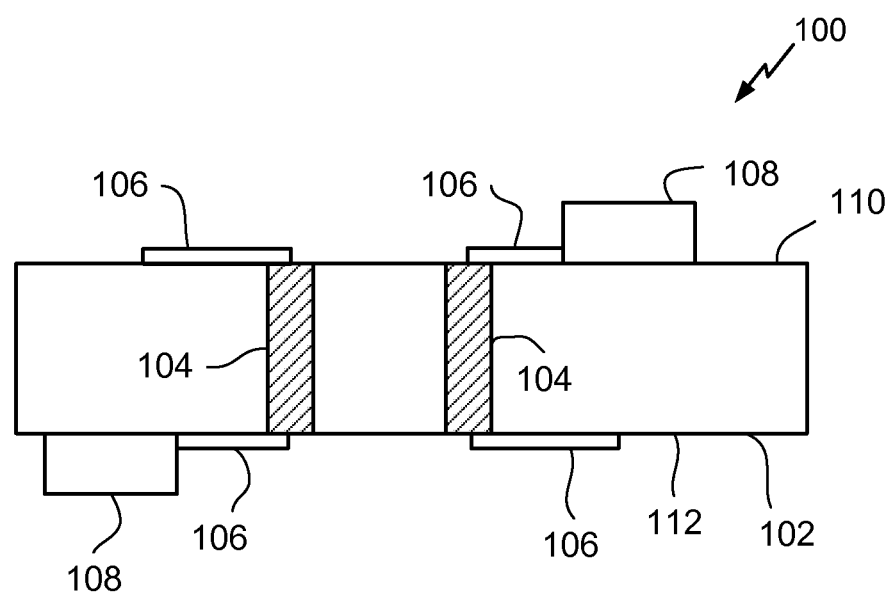
FIG. 1 is a cross-section of an electronic device.

FIG. 1 is a cross-section of an electronic device 100 according to an example implementation. The electronic device 100 includes a substrate 102, such as a printed circuit board (PCB) or the like. The PCB 102 includes transmission line vias 104 extending between a top surface 110 and a bottom surface 112 of the PCB 102. The transmission line vias 104 can be coupled to transmission line(s) 106 on either or both of the top and bottom surfaces 110 and 112 (e.g., four transmission lines 106 are shown). The transmission line(s) 106 can be coupled to various electronic components 108 mounted to the PCB 102 (e.g., two electronic components 108 are shown). In an example, the transmission line(s) 106 comprise 50 Ohm transmission lines, and the transmission line vias 104 are tuned close to 50 Ohm transmission lines to minimize discontinuity at the connection to the transmission lines 106.

In various examples described herein, the transmission line vias 104 comprise coaxial vias having a non-solid dielectric structure between the ground and signal conductors. The non-solid dielectric structure can include dielectric support structures supporting the signal conductor and separating the signal conductor from the ground conductor. The volume between support structures can be occupied by air. The dielectric support structures can be minimized such that the dielectric between the ground and signal conductors is substantially an air dielectric. With air as the dielectric, the overall size of the transmission line vias 104 can be reduced as compared to vias with a solid dielectric. Reduced size vias can provide for improved routing and reduced real estate on the PCB 102.

Figure 2A:
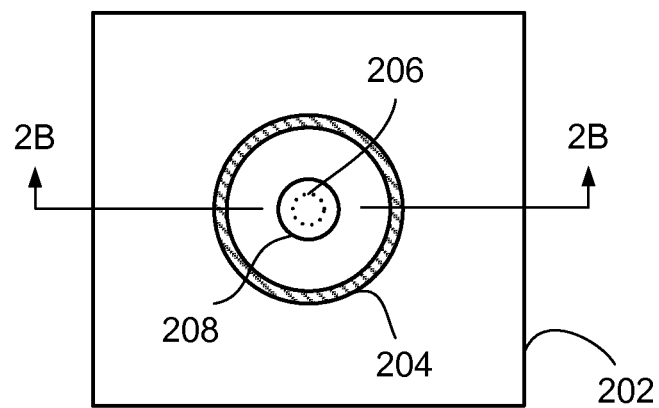
FIGS. 2A and 2B show a portion of a PCB having a transmission line via.
Figure 2B:
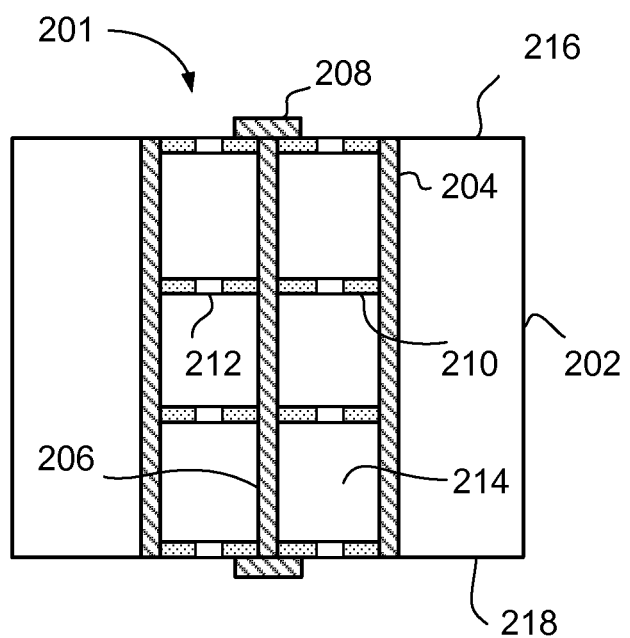

FIGS. 2A and 2B show a portion 202 of a PCB having a transmission line via 201 according to an example implementation. FIG. 2A shows a top view of the PCB portion 202, while FIG. 2B shows a cross-section view taken along the line 2B-2B. Referring simultaneously to FIGS. 2A and 2B, the transmission line via 201 includes an outer conductor 204 around a center conductor 206. The center conductor 206 extends between top and bottom surfaces 216 and 218 of the PCB portion 202 along a longitudinal axis of the transmission line via 201. A plurality of dielectric support members 210 are disposed in the via 201 to support the center conductor 206 in the via and separate the center conductor 206 from the outer conductor 204. A volume 214 between each of the dielectric support members 210 contains air. Thus, the dielectric between the center conductor 206 and the outer conductor 204 is a non-solid dielectric that comprises dielectric support members 210 and air. The dielectric support members 210 can include a plurality of bores 212 therein. As described below, the bores 212 can be used to remove sacrificial material during manufacture of the via 201 to form the volume 214 between the dielectric support members 210. Conductive bond pads 208 can be formed on the PCB portion 202 coupled to the center conductor 206 or formed as part of forming the center conductor 206, as described below.

Figure 3A:
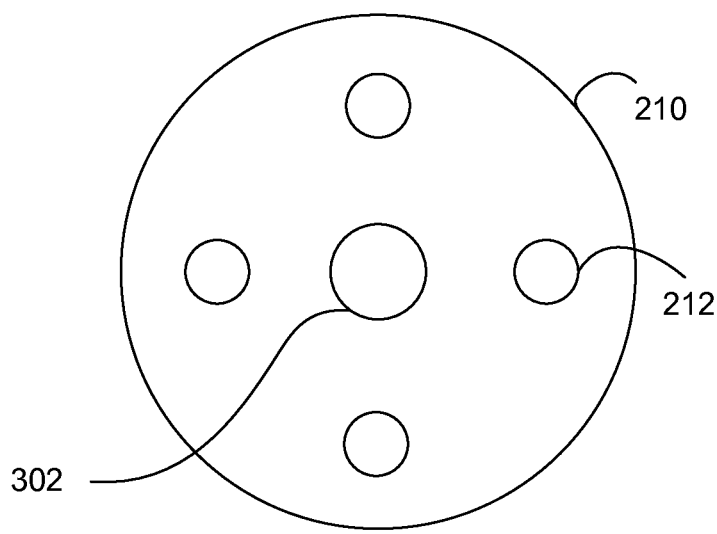
FIGS. 3A and 3B show a dielectric support member.
Figure 3B:
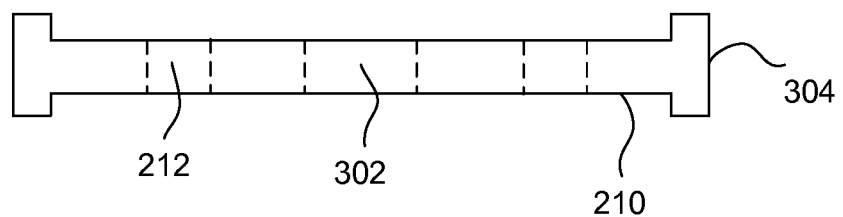

FIGS. 3A and 3B show a dielectric support member 210 according to an example implementation. FIG. 3A shows a top-view of the dielectric support 210, and FIG. 3B shows a side view. Referring simultaneously to FIGS. 3A and 3B, The dielectric support member 210 comprises a cylinder or disc of dielectric material, such as plastic (e.g., acrylonitrile butadiene styrene (ABS), polyethelene, etc.), polyimide (e.g., KAPTON or like materials), or the like. The dielectric support 210 includes a central bore 302 through which the center conductor of the transmission line via passes. The dielectric support 210 further includes the plurality of bores 212 around the central bore 302. As described herein, the bores 212 can be used to remove sacrificial material during manufacture. In an example, an edge 304 of the dielectric support member 210 is thicker than the inner portion of the dielectric support member 210. For example, the edge 304 can include a rib on the top and/or bottom of the support member 210. The edge 304 facilitates mounting of the dielectric support member 210 in the transmission line via.

Figure 4A:
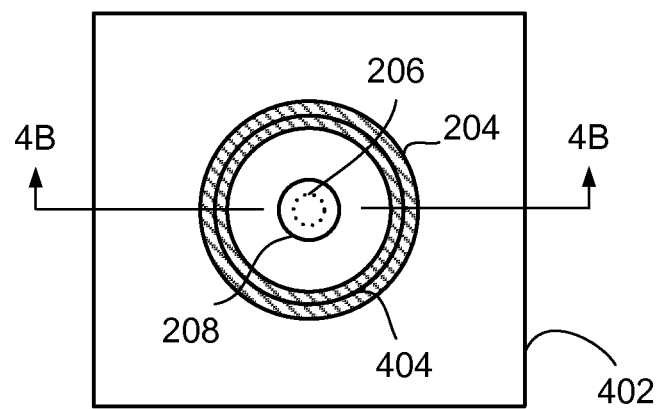
FIGS. 4A and 4B show a portion of a PCB having a transmission line via.
Figure 4B:
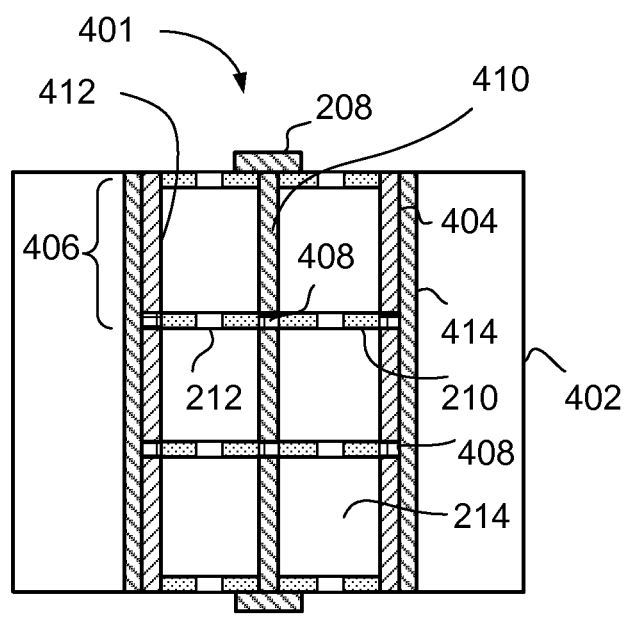

FIGS. 4A and 4B show a portion 402 of a PCB having a transmission line via 401 according to an example implementation. FIG. 4A shows a top-view of the transmission line via 401, and FIG. 4B shows a cross-section view taken along the line 4B-4B. Elements of FIGS. 4A and 4B that are the same or similar to those of FIGS. 2A and 2B are designated with identical reference numerals. Referring simultaneously to FIGS. 2A and 2B, the transmission line via 401 includes a plurality of sub-structures 406 stacked in the via 401 along a longitudinal axis thereof. Each of the sub-structures 406 includes a center conductor portion 410 extending along the longitudinal axis of the via 401, and an outer conductor portion 412 disposed around the center conductor portion 410. Each of the sub-structures 406 includes at least one dielectric support member 210 that support the center conductor portions 410 and separate the center conductor portions 410 from the outer conductor portions 412. The dielectric support members 210 can be configured as described above.

The transmission line via 401 further includes conductive paste or adhesive (referred to as conductive paste 408 herein) disposed between the center and outer conductor portions 410 and 412 of successive ones of the sub-structures 406. In this manner, the outer conductor portions 410 electrically combine to form an outer conductor, and the inner conductor portions 412 electrically combine to form an inner conductor. In an example, the via 401 can include a further outer conductor 414 formed around the outer conductor portions 410. As described above, the volume 214 between dielectric support members 210 contains air. By forming the via 401 from sub-structures 406, a high-aspect ratio via can be formed. The ratio of the length of the center conductor to its diameter can be greater than 30:1.

Figure 5:
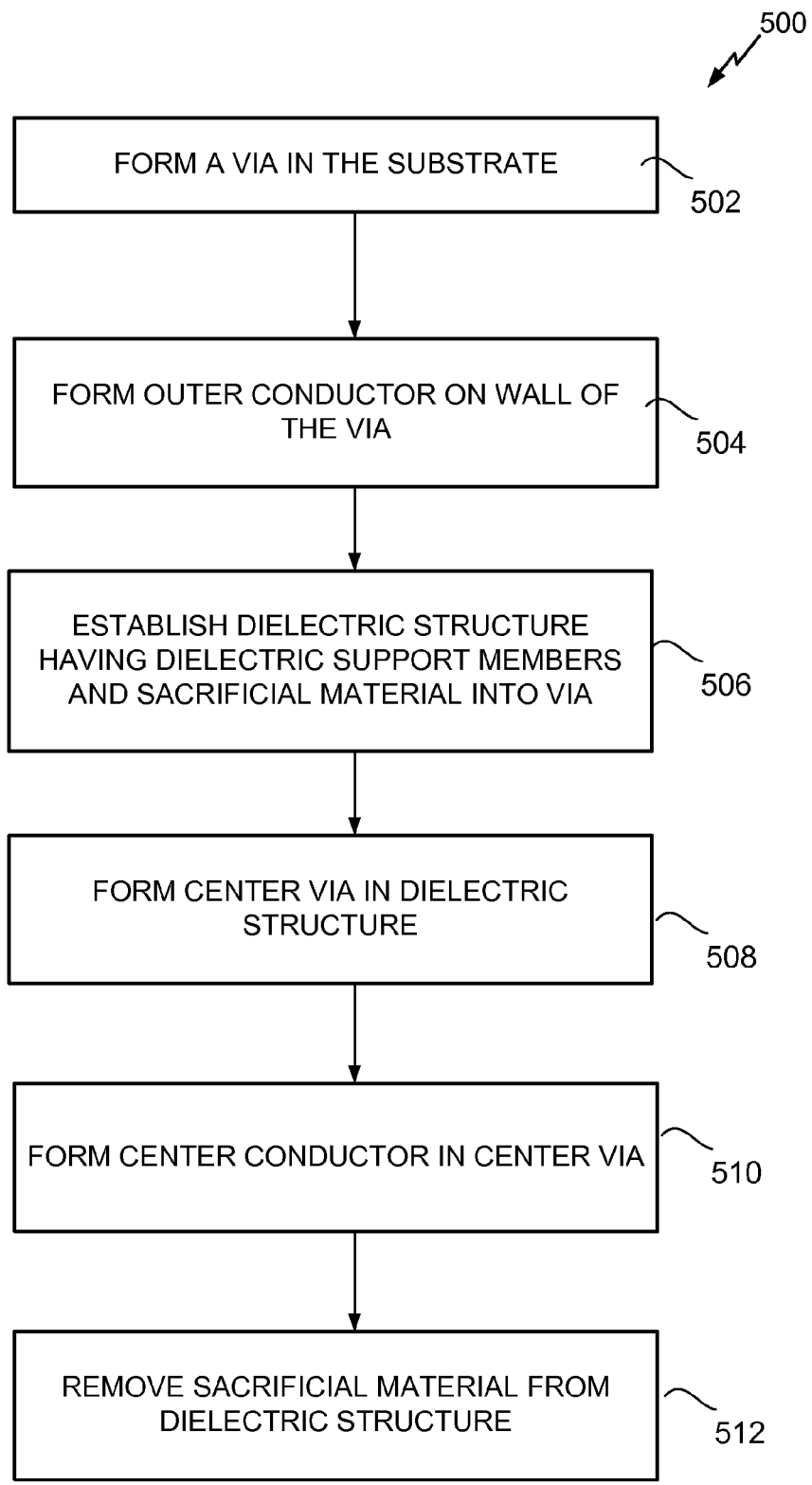
FIG. 5 is a flow diagram depicting a method of forming a transmission line via in a substrate.
Figure 6A:
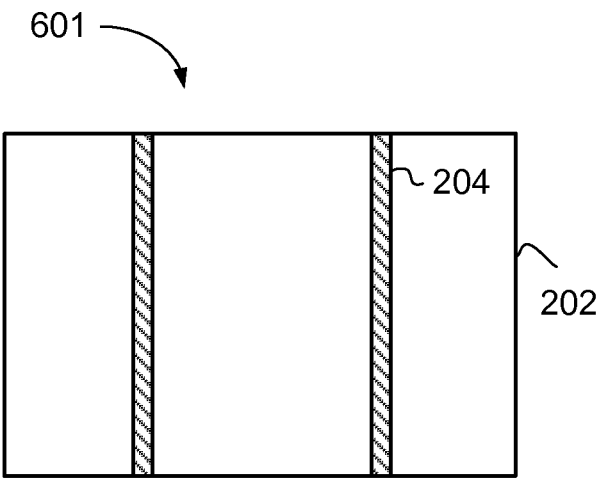
FIGS. 6A through 6C show cross-sections of a substrate after different steps of the method shown in FIG. 5.

FIG. 5 is a flow diagram depicting a method 500 of forming a transmission line via in a substrate according to an example implementation. The method 500 can be understood with reference to FIGS. 2A-B, 6A-6C, and 7, as described below. The method 500 can be used to form the transmission line via 201 as shown in FIGS. 2A-B and described above. The method 500 begins at step 502, where a via is formed in the substrate extending between top and bottom surfaces thereof along a longitudinal axis. For example, a hole can be drilled through the substrate using a laser drill or like type of drill used in semiconductor/electric device manufacturing processes. At step 504, an outer conductor is formed on the wall of the via. For example, conductive material can be electroplated on the sidewall of the via. The conductive material can include Cu, Al, Au, or like type of metal or any alloys of such metals. FIG. 6A shows a cross-section of a substrate (e.g., the PCB portion 202 shown in FIGS. 2A and 2B) having a via 601 and an outer conductor 204 formed on the wall of the via 601.

Figure 6B:
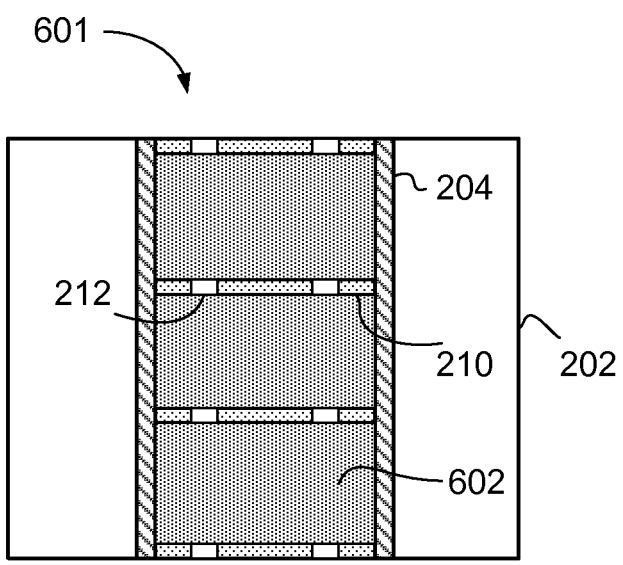

At step 506, a dielectric structure is established in the via having dielectric support members and sacrificial material. FIG. 6B shows a cross-section of a substrate (e.g., the PCB portion 202) having a dielectric structure with the dielectric support members 210 and sacrificial material 602 therebetween. In an example, the dielectric support members 210 can be formed separate from the transmission line via. For example, the dielectric support members 210 can be formed using any technique for forming plastic parts, such as a 3D printer, injection molding, or the like. The dielectric structure can be formed in place by inserting a dielectric support member 210, depositing sacrificial material 602, inserting another dielectric support member 210, depositing another layer of sacrificial material 602, and so on. The sacrificial material 602 can include a dielectric material such as a water-soluble polymer. A non-limiting example of a water-soluble polymer is poly(acrylic acid) (PAA). The sacrificial material 602 is chosen such that it can be removed without removing or damaging the dielectric support members 210.

Figure 6C:
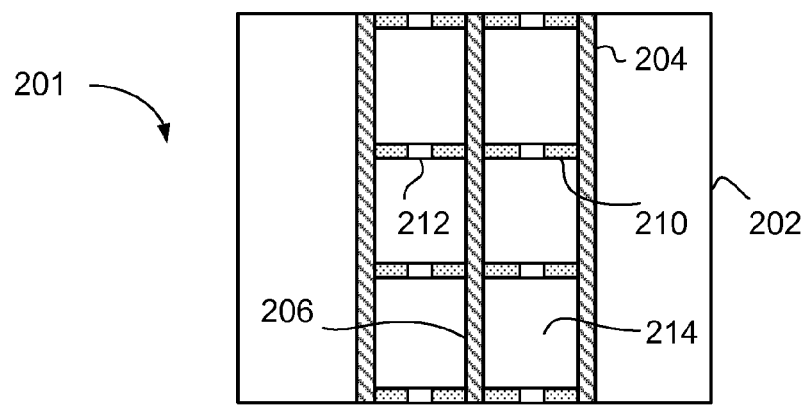

At step 508, a center via is formed in the dielectric structure. For example, a hole can be drilled through the dielectric structure. In one example, the dielectric support members 210 can be formed with a center bore and the only the sacrificial material 602 is drilled to form the center via. Alternatively, both the sacrificial material 602 and the dielectric support members 210 are drilled to form the center via. At step 510, a center conductor is formed in the center via. For example, a conductive material can be electroplated on the side walls of the center via. At step 512, the sacrificial material is removed from the dielectric structure. For example, the sacrificial material can be exposed to an etchant and drained through bores in the dielectric support members. FIG. 6C shows a cross-section of a substrate (e.g., the PCB portion 202) having the center conductor 206 in a center via. The sacrificial material 602 has been removed through the bores 212, leaving a volume of air between the dielectric support members 210.

Figure 7:
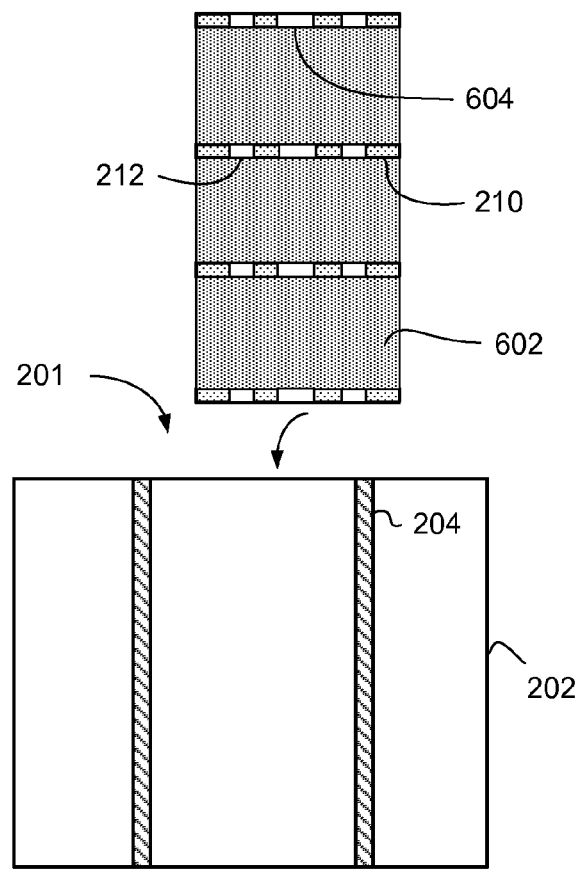
FIG. 7 is a cross-section of a substrate shown another example of forming a dielectric structure in the method shown in FIG. 5.

FIG. 7 shows a cross-section of a substrate (e.g., the PCB portion 202) according to another example implementation. At step 506, instead of forming the dielectric structure in place as shown in FIG. 6B, the dielectric structure can be formed separately from the via and then inserted into the via.

Figure 8:
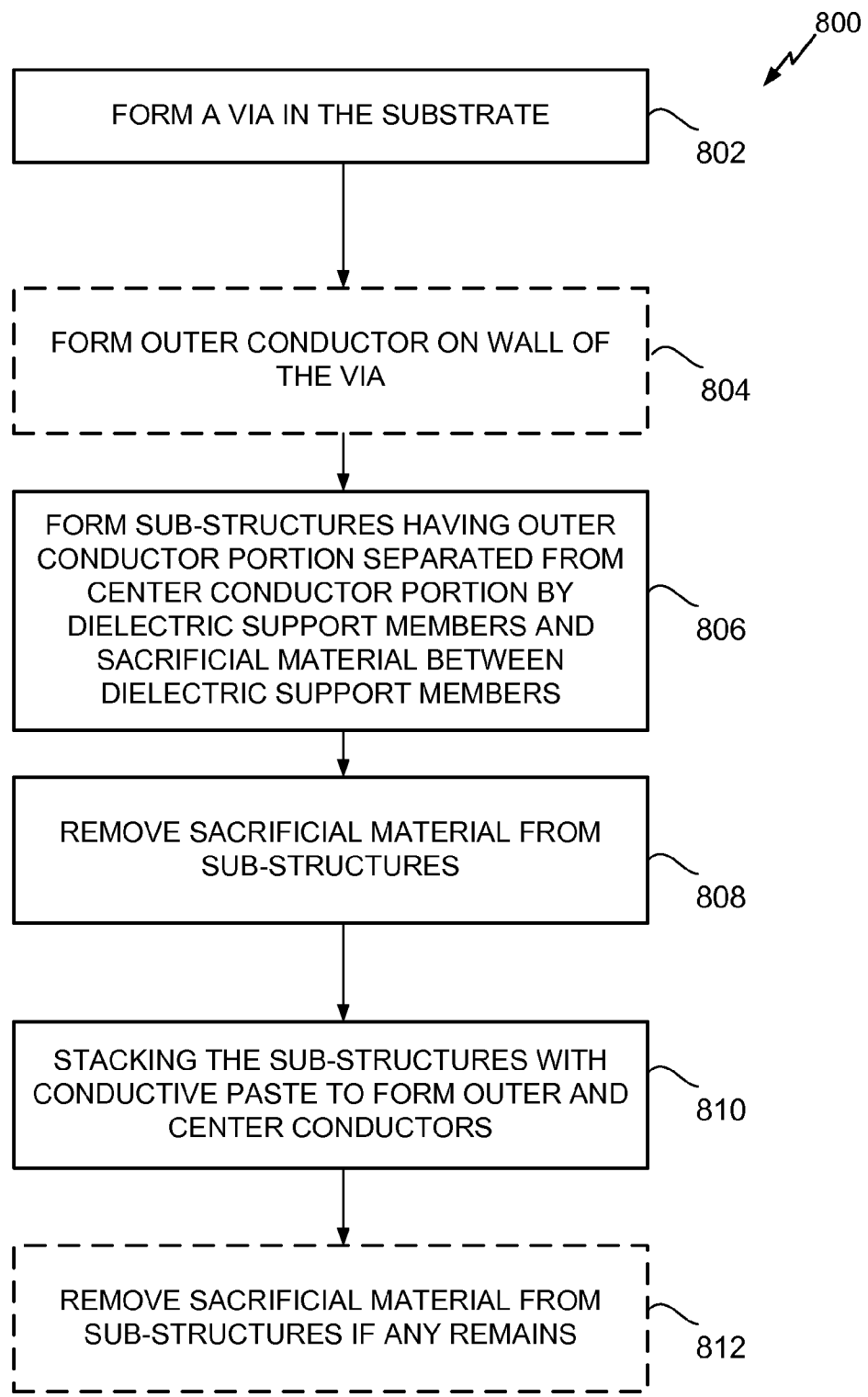
FIG. 8 is a flow diagram depicting a method of forming a transmission line via in a substrate.
Figure 9:
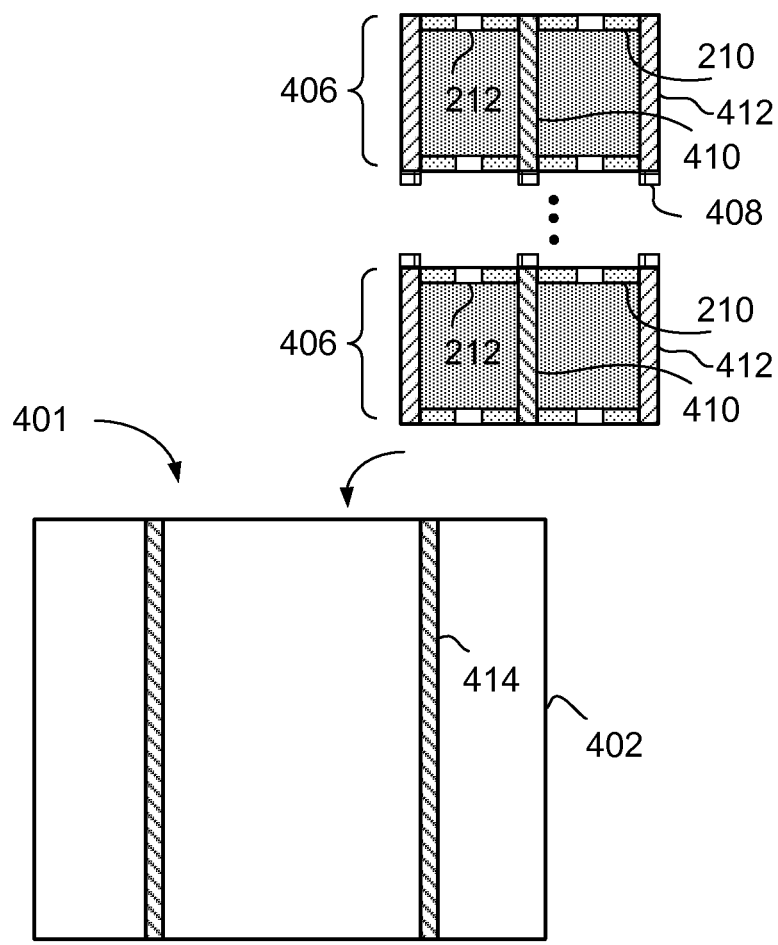
FIG. 9 is a cross-section of a substrate after steps of the method shown in FIG. 8.

FIG. 8 is a flow diagram depicting a method 800 of forming a transmission line via in a substrate according to another example implementation. The method 800 can be understood with reference to FIGS. 4A-B and 9, as described below. The method 800 can be used to form the transmission line via 401 as shown in FIGS. 4A-B and described above. The method 800 begins at step 802, where a via is formed in the substrate. For example, a hole can be drilled in the substrate. At step 804, an outer conductor can be formed on the wall of the via. Alternatively, step 804 can be omitted. At step 806, sub-structures are formed that have an outer conductor portion separated from a center conductor portion by dielectric support members. The sub-structures include sacrificial material between the dielectric support members. FIG. 9 shows a cross-section of a substrate (e.g., the PCB substrate 402) showing the sub-structures 406 as they are being inserted into the via 401.

At step 808, the sacrificial material is removed from the sub-structures. In an example, the sacrificial material can be removed prior to inserting the sub-structures into the via. In another example, step 808 can be omitted, leaving the sacrificial material in place until a subsequent step. At step 810, the sub-structures are stacked in the via with conductive paste between outer and center conductor portions to form combined outer and center conductors. At step 812, if any sacrificial material remains, the sacrificial material can be removed. For example, the sacrificial material can be removed through bores in the dielectric support members, as described above.

While the foregoing is directed to exemplary structures and methods, other and further embodiments may be devised without departing from the basic scope thereof, which is determined by the claims that follow.

What is claimed is:

1. A transmission line via structure in a substrate, comprising:
   a plurality of sub-structures stacked in a via through the substrate along a longitudinal axis thereof, each of the sub-structures including:
      a center conductor portion extending along the longitudinal axis;
      an outer conductor portion disposed around the center conductor portion; and
      at least one dielectric support member supporting the center conductor portion, separating the outer conductor portion and the center conductor portion and providing a non-solid volume between the outer conductor portion and the center conductor portion, the at least one dielectric support member being disposed outside the non-solid volume; and
   conductive paste disposed between the center and outer conductor portions of successive ones of the plurality of sub-structures to form an outer conductor and a center conductor.

2. The transmission line via structure of claim 1, wherein a portion of the non-solid volume unoccupied by the at least one dielectric support member is occupied by air.

3. The transmission line via structure of claim 1, wherein each of the at least one dielectric support member comprises a disc of dielectric material having a plurality of bores therethrough.

4. The transmission line via structure of claim 3, wherein for each of the at least one dielectric support member, an edge of the disc that contacts the outer conductor portion is thicker than an inner portion of the disc.

5. The transmission line via structure of claim 1, wherein the via in the substrate is plated with a conductor surrounding the plurality of substructures.

6. The transmission line via structure of claim 1, wherein a ratio between a length of the center conductor and diameter of the center conductor is greater than 30:1.

7. The transmission line via structure of claim 1, wherein the center and outer conductors are coupled to at least one transmission line on at least one surface of the substrate.

8. A method of forming a transmission line via structure in a substrate, comprising:
   forming a via in the substrate extending between top and bottom surfaces thereof along a longitudinal axis;
   forming an outer conductor on a wall of the via;
   establishing a dielectric structure in the via, the dielectric structure including dielectric support members disposed along the longitudinal axis with sacrificial material therebetween;
   forming a center via in the dielectric structure;
   forming a center conductor in the center via; and
   removing the sacrificial material from the dielectric structure providing a non-solid volume between the center conductor and the outer conductor.

9. The method of claim 8, wherein the dielectric support members have bores therethrough, and the sacrificial material is removed through the bores.

10. The method of claim 8, wherein a portion of the non-solid volume unoccupied by dielectric support members is occupied by air.

11. The method of claim 8, wherein the establishing comprises:
   forming the dielectric structure apart from the substrate and inserting the dielectric structure into the via.

12. The method of claim 8, wherein the establishing comprises:
   forming the dielectric structure in place in the substrate.

13. The method of claim 8, wherein a ratio between a length and diameter of the center conductor is greater than 30:1.

14. A method of forming a transmission line via structure in a substrate, comprising:
    forming a via in the substrate extending between top and bottom surfaces thereof along a longitudinal axis;
    forming a plurality of sub-structures, each of the plurality of sub-structures including an outer conductor portion separated from an center conductor portion by dielectric support members and including sacrificial material between the dielectric support members;
    stacking the plurality of sub-structures in the via with conductive paste between the outer and center conductor portions of successive ones of the plurality of sub-structures to form an outer conductor and a center conductor; and
    removing the sacrificial material from each of the plurality of sub-structures providing a non-solid volume between the center conductor portion and the outer conductor portion.

15. The method of claim 14, wherein the dielectric support members have bores therethrough, and the sacrificial material is removed through the bores.

16. The method of claim 14, wherein a portion of the non-solid volume unoccupied by dielectric support members is occupied by air.

17. The method of claim 14, wherein the sacrificial material is removed from each of the plurality of sub-structures prior to the step of stacking.

18. The method of claim 14, wherein the sacrificial material is removed from each of the plurality of sub-structures after the step of stacking.

19. The method of claim 14, wherein a ratio between a length and diameter of the center conductor is greater than 30:1.

20. The method of claim 14, further comprising:
    plating the via prior to insertion of the plurality of sub-structures.

\* \* \* \* \*